United States Patent
Andersson et al.

(10) Patent No.: US 10,428,417 B2
(45) Date of Patent: Oct. 1, 2019

(54) COATED CUTTING TOOL

(71) Applicant: SECO TOOLS AB, Fagersta (SE)

(72) Inventors: Jon Andersson, Vasteras (SE); Mats Johansson Jöesaar, Orebro (SE); Stefan Larsson, Fagersta (SE)

(73) Assignee: Seco Tools AB, Fagersta (SE)

( * ) Notice: Subject to any disclaimer, the term of this patent is extended or adjusted under 35 U.S.C. 154(b) by 63 days.

(21) Appl. No.: 15/355,874

(22) Filed: Nov. 18, 2016

(65) Prior Publication Data
US 2017/0145556 A1 May 25, 2017

(30) Foreign Application Priority Data
Nov. 20, 2015 (EP) .................... 15195692

(51) Int. Cl.
*B23B 27/14* (2006.01)
*C23C 14/06* (2006.01)
(Continued)

(52) U.S. Cl.
CPC ........ *C23C 14/0641* (2013.01); *B23B 27/148* (2013.01); *B23B 51/00* (2013.01); *C04B 41/009* (2013.01); *C04B 41/52* (2013.01); *C04B 41/89* (2013.01); *C23C 14/325* (2013.01); *C23C 28/044* (2013.01); *C23C 28/42* (2013.01); *B23B 2222/16* (2013.01); *B23B 2222/28* (2013.01); *B23B 2224/08* (2013.01);
(Continued)

(58) Field of Classification Search
USPC .......... 51/307, 309; 428/216, 336, 697, 698, 428/699, 701, 702, 704; 204/192, 192.1, 204/192.15, 192.16; 407/119
See application file for complete search history.

(56) References Cited

U.S. PATENT DOCUMENTS

| | | | | |
|---|---|---|---|---|
| 5,503,912 A | * | 4/1996 | Setoyama | ........... C03C 17/3435 428/216 |
| 5,639,285 A | * | 6/1997 | Yao | ..................... C04B 35/5831 428/698 |

(Continued)

FOREIGN PATENT DOCUMENTS

| | | | |
|---|---|---|---|
| KR | 2005116501 | * | 12/2005 |
| WO | 9940233 A1 | | 8/1999 |

(Continued)

*Primary Examiner* — Archene A Turner
(74) *Attorney, Agent, or Firm* — Corinne R. Gorski

(57) ABSTRACT

A coated cutting tool includes a body and a hard and wear resistant PVD coating on the body, wherein the body is made from a cemented carbide, cermet, ceramics, polycrystalline diamond or polycrystalline cubic boron nitride based materials. The coating includes a first (Ti,Al)-based nitride sub-coating and a second (Ti,Al)-based nitride sub-coating. The first (Ti,Al)-based nitride sub-coating can be a single layer, and the second (Ti,Al)-based nitride sub-coating can be a laminated structure, wherein the first (Ti,Al)-based nitride sub-coating includes a $(Ti_{1-x}Al_x)N_z$-layer where $0.1<x<0.4$, $0.6<z<1.2$, and wherein the second (Ti,Al)-based nitride sub-coating includes a $(Ti_{1-x1-y1}Al_{x1}Cr_{y1})N_{z1}$ layer where $0.5<x1<0.75$, $0.05<y1<0.2$, $0.6<z1<1.2$.

17 Claims, 2 Drawing Sheets

(51) Int. Cl.
*C23C 14/32* (2006.01)
*B23B 51/00* (2006.01)
*C23C 28/04* (2006.01)
*C23C 28/00* (2006.01)
*C04B 41/89* (2006.01)
*C04B 41/00* (2006.01)
*C04B 41/52* (2006.01)

(52) U.S. Cl.
CPC ....... *B23B 2224/32* (2013.01); *B23B 2224/36* (2013.01); *B23B 2226/125* (2013.01); *B23B 2226/18* (2013.01); *B23B 2226/315* (2013.01); *B23B 2228/08* (2013.01); *B23B 2228/105* (2013.01)

(56) References Cited

U.S. PATENT DOCUMENTS

| | | | |
|---|---|---|---|
| 6,309,738 B1 * | 10/2001 | Sakurai | C23C 14/0641 407/119 |
| 2002/0168552 A1 | 11/2002 | Yamamoto et al. | |
| 2010/0047545 A1 | 2/2010 | Yamamoto et al. | |
| 2011/0033723 A1 | 2/2011 | Kim et al. | |
| 2012/0042576 A1 * | 2/2012 | Can | C04B 35/5831 51/309 |
| 2013/0309468 A1 | 11/2013 | Kudo et al. | |
| 2017/0029931 A1 | 2/2017 | Hirano et al. | |

FOREIGN PATENT DOCUMENTS

| | | |
|---|---|---|
| WO | 2012069475 A1 | 5/2012 |
| WO | 2014177503 A1 | 11/2014 |

* cited by examiner

COATED CUTTING TOOL

RELATED APPLICATION DATA

This application claims priority under 35 U.S.C. § 119 to EP Patent Application No. 15195692.7, filed on Nov. 20, 2015, which the entirety thereof is incorporated herein by reference.

TECHNICAL FIELD

The present disclosure relates to a coated cutting tool for chip forming metal machining including a body and a coating for use in metal cutting applications generating high tool temperatures, e.g., machining of steels, cast irons, super alloys, stainless steels and hardened steels in combination with a controlled machined surfaces roughness. The coating having two sub-coatings based on (Ti,Al)N deposited by means of physical vapor deposition (PVD).

BACKGROUND

Since the mid 1980's, efforts have been made to improve the properties, for example, wear resistance and hence the performance of tool coatings. At that time, the common practice was to coat cutting tools with TiN. However, due to its relatively poor oxidation resistance at elevated temperatures, alloying Al in (Ti,Al)N was suggested and implemented with good results in the mid-1980's.

Today (Ti,Al)N based coatings are among the most common hard and protective coating materials used in metal cutting applications. The cubic, B1, structure of (Ti,Al)N, as a monolith layer or part of a laminated coating structure, combine attractive mechanical properties such as high hardness and improved temperature and oxidation resistance providing good performance in metal machining applications. The technological benefits of (Ti,Al)N and its excellent physical properties, especially at elevated temperatures, is partly explained in terms of a spinodal decomposition process during which cubic (Ti,Al)N decompose isostructurally into coherent cubic c-AlN- and c-TiN-enriched domains. The combination of elastic properties and a lattice mismatch between coherent c-AlN- and c-TiN-enriched domains leads to significant age hardening during which the hardness of (Ti,Al)N thin layers have shown to increase with between 15% and 20%. At further aging, c-AlN transforms into the thermodynamically stable hexagonal, wurtzite B4 structure, h-AlN resulting in a dual phase structure comprising c-TiN and h-AlN with reduced mechanical properties.

To further enhance the performance of tool coatings, a wide range of ternary and quaternary systems have been investigated. For example, it has been shown that alloying Cr in (Ti,Al,Cr)N improves the coating behavior in metal cutting applications. International published patent application WO2012/069475 discloses a coated cutting tool having a hard and wear resistant coating comprising a layer of $(Ti_cAl_aCr_bMe_d)(C_zO_yN_x)$ where $0.10<a<0.60$, $b+d>0.20$, $c>0.05$, $0\le d<0.25$, $0.75<x<1.05$, $0\le y<0.25$ and $0\le z\le 0.25$ with a layer thickness between 0.5 and 10 μm.

Todays industry continuously seeks solutions for economic and high productivity/feed-through manufacturing. To meet these demands there is a need for new materials with advanced properties to improve tool life during operation. Within the metal cutting tool industry, a major part of this effort is focused to improve the wear behavior of the cutting tools by designing the properties of the coating material used in the application. Typically, a high productivity/feed-through cutting process results in a dramatic increase of the tool temperature and hence a coating material with a high temperature wear resistance is essential.

SUMMARY

To overcome the above disadvantages, the present disclosure is directed to provide a coated cutting tool with a coating showing improved high temperature properties, improved performance in metal cutting applications generating high temperatures with controlled machined surface roughness.

According to a first aspect of the present disclosure there is provided a hard and wear resistant PVD coating on the body, wherein the body includes cemented carbide, cermet, ceramics, polycrystalline diamond or polycrystalline cubic boron nitride based materials, and the coating includes a first (Ti,Al)-based nitride sub-coating and a second (Ti,Al)-based nitride sub-coating, the first (Ti,Al)-based nitride sub-coating being a single layer, and the second (Ti,Al)-based nitride sub-coating being a laminated structure, wherein the first (Ti,Al)-based nitride sub-coating includes a $(Ti_{1-x}Al_x)N_z$-layer where $0.1<x<0.4$, $0.6<z<1.2$, and that the second (Ti,Al)-based nitride sub-coating (3) includes a $(Ti_{1-x1-y1}Al_{x1}Cr_{y1})N_{z1}$-layer where $0.5<x1<0.75$, $0.05<y1<0.2$, $0.6<z1<1.2$.

A body as described in the present description and claims should be understood as a substrate onto which the hard and wear resistant PVD coating is deposited. Common for cutting tools is that this body, e.g., a cutting tool insert, may be a solid body or a body comprising a backing body onto which an additional material is placed, either over the cutting edge on the rake face, a so called tipped body, or such that the it covers the full rake, a so called full face body. The tipped or full face solutions are frequently used in cutting technologies based on polycrystalline diamond or polycrystalline cubic boron nitride materials.

According to one embodiment, $0.15<x<0.35$, for example, $0.2\le x<0.3$.

According to one embodiment, $0.7<z\le 1.1$, for example, $0.8<z\le 1.1$ or $0.9\le z<1.1$.

According to one embodiment, $0.55<x1<0.75$, for example, $0.55<x1<0.70$.

According to one embodiment, $0.05\le y1<0.15$.

According to one embodiment, $0.7<z1\le 1.1$, for example, $0.8<z1\le 1.1$ or $0.9\le z1\le 1.1$.

According to one embodiment, the first (Ti,Al)-based nitride sub-coating has a thickness between 0.1 μm and 2 μm, for example, between 0.3 μm and 1 μm, or 0.3 μm and 0.8 μm.

According to one embodiment, the second (Ti,Al)-based nitride sub-coating is a laminated structure having alternating A and B layers: A/B/A/B/A/B/ . . . , where layer A is $(Ti_{1-x}Al_x)N_z$, $0.1<x<0.4$, $0.6<z<1.2$, and layer B is $(Ti_{1-x1-y1}Al_{x1}Cr_{y1})N_{z1}$, $0.5<x1<0.75$, $0.05<y1<0.2$, $0.6<z1<1.2$.

According to one embodiment, the A and B layers have an average individual layer thickness between 1 nm and 100 nm, for example, 5 nm and 50 nm, or between 5 nm and 30 nm as measured by, e.g., cross sectional transmission electron microscopy of a middle region of the second sub-coating, i.e., in a region between 30% to 70% of its thickness, and the average layer thickness is the average from measuring the thickness of at least ten adjacent layers.

According to one embodiment, the second (Ti,Al)-based nitride sub-coating has a thickness between 0.5 μm and 10 μm, for example between 1 and 5 μm, or between 1 μm and 3 μm.

According to one embodiment, the coated cutting tool includes an innermost single or laminated layer structure arranged on and in contact with the body, and including any of the following compositions: TiN, TiC, Ti(C,N) or (Ti,Al)N. The innermost layer structure can be a single layer of (Ti,Al)N, followed by the functional hard and wear resistant coating.

According to one embodiment, the innermost layer structure has a thickness between 0.05 μm and 0.3 μm, or between 0.1 μm and 0.3 μm.

According to one embodiment, the coated cutting tool includes an outermost single or laminated layer structure arranged on the coating, and including any of the following compositions: TiN, TiC, Ti(C,N) or (Ti,Al)N. The outermost layer structure can be a single layer of TiN or (Ti,Al)N, followed by the functional hard and wear resistant coating.

According to one embodiment of the present disclosure, the outermost layer structure is $(Ti_{1-x}Al_x)N_z$.

According to one embodiment the outermost layer structure has a thickness between 0.05 μm and 0.5 μm, or between 0.1 μm and 0.3 μm.

According to one embodiment, the total thickness of the coating, including any innermost or outermost layer structure is between 0.8 μm and 15 μm, for example, between 1 μm and 10 μm, or between 1 μm and 6 μm.

According to one embodiment, the average composition of the coating, including any innermost or outermost layer structures, can be, for example, 55 at %<% Ti<62 at %; 57 at %<% Ti<62 at %; 57 at %<% Ti<60 at %; 32 at %<% Al<40 at %; 34 at %<% Al<40 at %; 34 at %<% Al<38 at %; 1 at %<% Cr<9 at %; 3 at %<% Cr<9 at %; 3 at %<% Cr<7 at %; % Ti+% Al+% Cr=100 at % and balanced with N as determined by EDS.

According to one embodiment the body consists of cemented carbide comprising WC and 4-15 wt % Co.

According to one embodiment, the body is polycrystalline cubic boron nitride (PCBN) containing at least one cubic boron nitride (cBN) grain size distribution in a binder. According to one embodiment, the binder contains up to 3 vol % WC.

According to one embodiment, the body is polycrystalline cubic boron nitride (PCBN) containing at least 25 vol % of cubic boron nitride (cBN) in a binder. According to one embodiment, the binder for the previously described embodiment includes at least one nitride, boride, oxide, carbide or carbonitride compound with one or more of the following group of elements: Ti, Zr, Hf, V, Nb, Ta, Cr, Mo, W and Al. Examples thereof are TiCN, $TiB_2$ and WC.

According to one embodiment, the body is polycrystalline cubic boron nitride (PCBN) containing 30 vol %<cBN<75 vol %, preferably 35 vol %<cBN<70 vol %, in a binder, and with an average cBN grain size between 0.5 μm and 10 μm, for example, between 0.5 μm and 5 μm. According to one embodiment, the binder contains 80 wt %<Ti(C,N)<95 wt % and the rest of the binder comprising compounds from two or more of the following group of elements: Ti, N, B, Ni, Cr, Mo, Nb, Fe, Al and O.

According to one embodiment, the body is polycrystalline cubic boron nitride (PCBN) containing 30 vol %<cBN<75 vol %, for example, 45 vol %<cBN<70 vol %, 55 vol %<cBN<65 vol %, in a binder, with an average cBN grain size between 0.5 μm and 5 μm, for example, between 1 μm and 3 μm. The binder can contain 80 wt %<Ti(C,N)<90 wt %; less than 1 wt. % of an alloy including one or more of the following group of elements: Ni, Co, Cr; less than 10 wt % Mo; and the rest of the binder includes at least one of the following compounds: $TiB_2$. $Al_2O_3$.

According to one embodiment, the body is polycrystalline cubic boron nitride (PCBN) containing 35 vol %<cBN<70 vol % in a binder with a bimodal cBN grain size distribution, where at least about 50% of the cBN grains have a grain size<5 μm and at least 20% of the grains have a grain size>5 μm. The binder contains at least one compound including aluminium (Al) and at least one compound including titanium (Ti). Examples thereof are titanium carbonitride, titanium carbide, titanium nitride, aluminum nitride and aluminum boride.

Another aspect of the coated cutting tool according to the present disclosure is that the hard and wear resistant coating has improved temperature resistance. Yet another of the coated cutting tool according the present disclosure is that a coated cutting tool having improved performance in metal cutting applications generating high temperatures is achieved. Still another aspect of the coated cutting tool according to the present disclosure is that the use of the same results in reduced roughness of the machined surface.

According to another aspect of the present disclosure there is provided a method for producing a coated cutting tool including a body and a hard and wear resistant coating by applying PVD (physical vapor deposition) techniques, for example, cathodic arc evaporation, the method comprising:

1. cleaning of the body prior to deposition, and
2. growth of (Ti,Al)N and (Ti,Al,Cr)N layers by using composite or alloyed (Ti,Al) and (Ti,Al,Cr) cathodes, respectively, applying an evaporation current between 50 A and 200 A, using a reactive gas atmosphere comprising pure N2 or mixed N2 and, e.g., Ar gases at a total gas pressure between 1.0 Pa and 8.0 Pa, preferably between 1.0 Pa and 5.0 Pa, between 2.0 Pa and 5.0 Pa, most preferably between 3.0 Pa and 5.0 Pa, applying a negative substrate bias between 20 V and 300 V, preferably between 40 V and 150 V, most preferably between 50 V and 100 V, and applying a deposition temperature between 200° C. and 800° C., for example, between 300° C. and 600° C. \

According to a third aspect of the present disclosure there is provided a use of a coated cutting tool according to any of the above described embodiments for machining at cutting speeds of, for example, 50-400 m/min, 75-300 m/min, with an average feed, per tooth in the case of milling, of for example, 0.08-0.5 mm, 0.1-0.4 mm, depending on cutting speed and insert geometry.

The foregoing summary, as well as the following detailed description of the embodiments, will be better understood when read in conjunction with the appended drawings. It should be understood that the embodiments depicted are not limited to the precise arrangements and instrumentalities shown.

DETAILED DESCRIPTION

Figure 1:
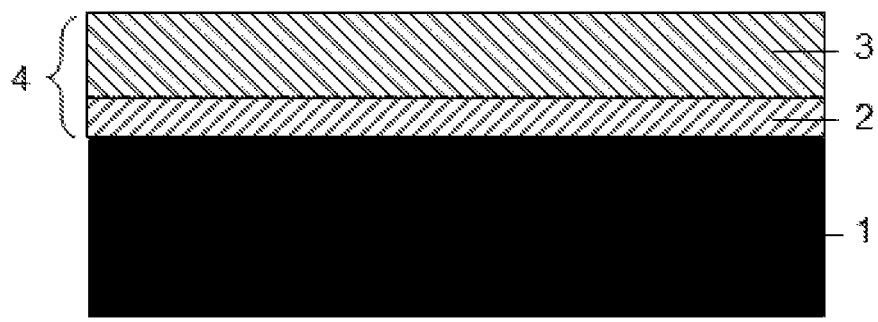
FIG. 1 is a schematic view of one embodiment of the present disclosure.

According to one embodiment of the present disclosure, schematically shown in FIG. 1, there is provided a coated cutting tool including a body 1 and a hard and wear resistant coating 4 on the body. The coating 4 includes a first (Ti,Al)-based nitride sub-coatings 2 being a single $(Ti_{1-x}Al_x)N_z$ layer with $0.15<x<0.35$ or $0.2 \leq x<0.3$, and $0.9 \leq z \leq 1.1$ with a thickness between 0.3 μm and 0.8 μm, and a second (Ti,Al)-based nitride sub-coating 3 being a laminated structure having alternating A and B layers: A/B/A/B/A/B . . . where layers A is $(Ti_{1-x}Al_x)N_z$ where $0.15<x<0.35$, or $0.2 \leq x<0.3$, and $0.9 \leq z \leq 1.1$, and layer B is $(Ti_{1-x1-y1}Al_{x1}Cr_{y1})N_{z1}$ where $0.55<x1 \leq 0.7$, $0.05 \leq y1<0.15$, and $0.9 \leq z1 \leq 1.1$ with a thickness between 1 μm and 3 μm. The A and B layers have an average individual layer thickness between, for example, 1 nm and 100 nm, 5 nm and 50 nm, and 5 nm and 30 nm as measured by, e.g., cross sectional transmission electron microscopy of a middle region of the second sub-coating 3, i.e., in a region between 30% to 70% of its thickness. The average layer thickness is the average from measuring the thickness of at least ten adjacent layers.

It should be appreciated that the individual hard and wear resistant coating 4 may be part of a complex coating design and used as an inner, middle and/or an outer layer of a complex coating.

Figure 2:
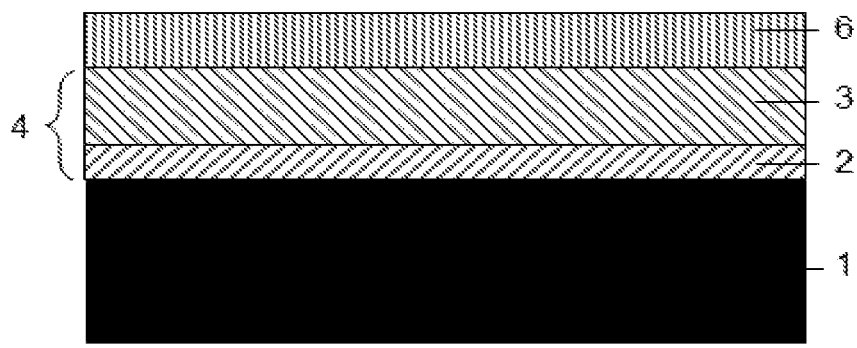
FIG. 2 is a schematic view of one embodiment of the present disclosure.

According to one embodiment of the present disclosure, schematically shown in FIG. 2, there is provided a coated cutting tool including a body 1 and a hard and wear resistant coating 4 on the body. The coating 4 has a first (Ti,Al)-based nitride sub-coatings 2 being a single $(Ti_{1-x}Al_x)N_z$ layer with $0.15<x<0.35$ or $0.2 \leq x<0.3$, and $0.9 \leq z \leq 1.1$ with a thickness between 0.3 μm and 0.8 μm, a second (Ti,Al) and a based nitride sub-coating 3 being a laminated structure consisting of alternating A and B layers: A/B/A/B/A/B . . . where layers A is $(Ti_{1-x}Al_x)N_z$ where $0.15<x<0.35$, or $0.2 \leq x<0.3$, and $0.9 \leq z \leq 1.1$, and layer B is $(Ti_{1-x1-y1}Al_{x1}Cr_{y1})N_{z1}$ where $0.55<x1 \leq 0.7$, $0.05 \leq y1<0.15$, and $0.9 \leq z1 \leq 1.1$ with a thickness between 1 μm and 3 μm.

An outermost single layer structure 6, arranged on the hard and wear resistant coating 4, can be TiN or (Ti,Al)N of a single layer of $(Ti_{1-x}Al_x)N_z$ layer with for example, $0.15<x<0.35$, $0.2 \leq x<0.3$, and $0.9 \leq z \leq 1.1$ with a thickness between 0.05 μm and 0.3 μm.

The A and B layers have an average individual layer thickness between for example, 1 nm and 100 nm, between 5 nm and 50 nm, or 5 nm and 30 nm as measured by, e.g., cross sectional transmission electron microscopy of a middle region of the second sub-coating 3, i.e., in a region between 30% to 70% of its thickness, and the average layer thickness is the average from measuring the thickness of at least ten adjacent layers.

Figure 3:
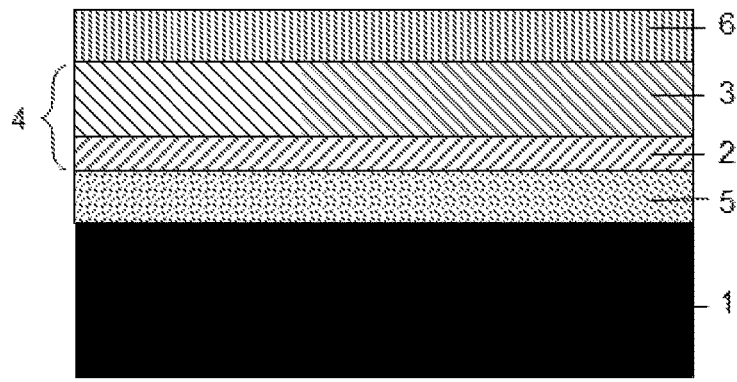
FIG. 3 shows a schematic view of one embodiment of the present disclosure.

According to one embodiment of the present disclosure, schematically shown in FIG. 3, there is provided a coated cutting tool including a body 1 and an innermost single or laminated layer structure 5 with a thickness between 0.05 and 0.3 μm arranged on and in contact with the body 1, of, e.g., TiN, TiC, Ti(C,N) or (Ti,Al)N, a hard and wear resistant coating 4 on the body. The coating 4 can have a first (Ti,Al)-based nitride sub-coatings 2 being a single $(Ti_{1-x}Al_x)N_z$ layer with for example, $0.15<x<0.35$, or $0.2 \leq x<0.3$, and $0.9 \leq z \leq 1.1$ with a thickness between 0.3 μm and 0.8 μm, a second (Ti,Al)-based nitride sub-coating 3 being a laminated structure of alternating A and B layers: A/B/A/B/A/B . . . where layers A is $(Ti_{1-x}Al_x)N_z$ where $0.15<x<0.35$, preferably $0.2 \leq x<0.3$, and $0.9 \leq z \leq 1.1$, and layer B is $(Ti_{1-x1-y1}Al_{x1}Cr_{y1})N_{z1}$ where $0.55<x1 \leq 0.7$, $0.05 \leq y1<0.15$, and $0.9 \leq z1 \leq 1.1$ with a thickness between 1 μm and 3 μm.

An outermost single layer structure 6 may be arranged on the hard and wear resistant coating 4 of TiN or (Ti,Al)N, for example, a single layer of $(Ti_{1-x}Al_x)N_z$ layer with $0.15<x<0.35$ or $0.2 \leq x<0.3$, and $0.9 \leq z \leq 1.1$ with a thickness between 0.05 μm and 0.3 μm. The A and B layers have an average individual layer thickness between 1 nm and 100 nm, for example, between 5 nm and 50 nm or between 5 nm and 30 nm as measured by, e.g., cross sectional transmission electron microscopy of a middle region of sub-coating 3, i.e., in a region between 30% to 70% of its thickness. The average layer thickness is the average from measuring the thickness of at least ten adjacent layers.

According to one embodiment of the present disclosure, the total thickness, i.e., the sum of the thicknesses for the innermost layer structure 5, if present, the outermost layer structure 6, if present, and coating 4, is between 0.8 μm and 15 μm, for example, between 1 μm and 10 μm, or between 1 μm and 6 μm.

The average composition of the layers was estimated by energy dispersive spectroscopy (EDS) analysis area using a LEO Ultra 55 scanning electron microscope operated at 20 kV and normal incidence to the coated surface equipped with a Thermo Noran EDS. Industrial standards and ZAF correction were used for the quantitative analysis. The metal composition was evaluated using a Noran System Six (NSS ver 2) software.

According to one embodiment of the present disclosure, the hard and wear resistant coating 4 includes a first (Ti, Al)-based nitride sub-coating 2 of a single layer $(Ti_{1-x-y}Al_x)N_z$, a second (Ti,Al)-based nitride sub-coating 3 of a laminated $(Ti_{1-x-y}Al_xCr_y)N_z$, $y=0$ and $(Ti_{1-x1-y1}Al_{x1}Cr_{y1})N_{z1}$ layers and an outermost 6 single layer of $(Ti_{1-x-y}Al_xCr_y)N_z$, $y=0$, and has an average composition of 55 at %<% Ti<62 at %, preferably 57 at %<% Ti<62 at; 57 at %<% Ti<60 at %, 32 at %<% Al<40 at %; 34 at %<% Al<40 at %; 34 at %<% Al<38 at %, 1 at %<% Cr<9 at %; or 3 at %<% Cr<9 at %; 3 at %<% Cr<7 at %, % Ti+% Al+% Cr=100 at % and balanced with N as determined by EDS.

Additionally, the coating 4, innermost layer structure 5, and outermost layer structure 6 may contain a sum of oxygen (O) and carbon (C) concentration between 0 and 3 at %, for example, between 0 and 2 at % as determined by EDS.

Coating phase detection was performed by X-ray diffractometry (XRD) using a Bruker AXS D8-advance x-ray diffractometer and Cu Kα radiation in Bragg-Brentano configuration. Typically, the detection limit for each phase in a polycrystalline mixed phase materials is less than 5 vol %.

According to one embodiment of the present disclosure, the first (Ti,Al)-based nitride sub-coating 2 is a cubic sodium chloride phase.

According to one embodiment of the present disclosure, the first (Ti,Al)-based nitride sub-coating 2 is of mixed cubic sodium chloride and hexagonal phases.

According to one embodiment of the present disclosure, the second (Ti,Al)-based nitride sub-coating 3 is a cubic sodium chloride phase.

According to one embodiment of the present disclosure, the second (Ti,Al)-based nitride sub-coating 3 is of mixed cubic sodium chloride and hexagonal phases.

Additionally, the coating 4 may also contain amorphous phases with small amounts, close to the detection limit of the XRD technique.

The deposition method for the functional hard and wear resistant coating 4 on a body 1 is based on PVD techniques, for example, reactive cathodic arc evaporation, using composite or alloyed (Ti,Al) and (Ti,Al,Cr) cathodes allowing for growth of (Ti,Al)N and (Ti,Al,Cr)N layers, respectively.

Prior to deposition, the body 1 is adequately cleaned by applying established ex-situ and in-situ cleaning procedures. The desired layer compositions are obtained by selecting the appropriate reactive gas atmosphere and composition of the (Ti,Al) and (Ti,Al,Cr) cathodes, respectively. (Ti,Al)N and (Ti,Al,Cr)N layers are grown with an evaporation current between 50 A and 200 A, a higher current for larger cathode size, in a reactive gas atmosphere comprising pure $N_2$ or mixed $N_2$ and, e.g., Ar gases at a total gas pressure between 1.0 Pa and 8.0 Pa, for example, between 1.0 Pa and 5.0 Pa, between 2.0 Pa and 5.0 Pa, or between 3.0 Pa and 5.0 Pa, and a negative substrate bias between 20 V and 300 V, for example, between 40 V and 150 V, or between 50 V and 100 V. The deposition temperature can be between 200° C. and 800° C., for example, between 300° C. and 600° C.

Single layers are deposited by allowing the body 1 to pass through the obtained deposition flux solely from one combination of cathodes and growth parameters according to the above, while laminated layers are grown by allowing the body 1 alternating pass through the obtained deposition flux from at least two different combination of cathodes but otherwise common growth parameters according to the above.

Figure 4:
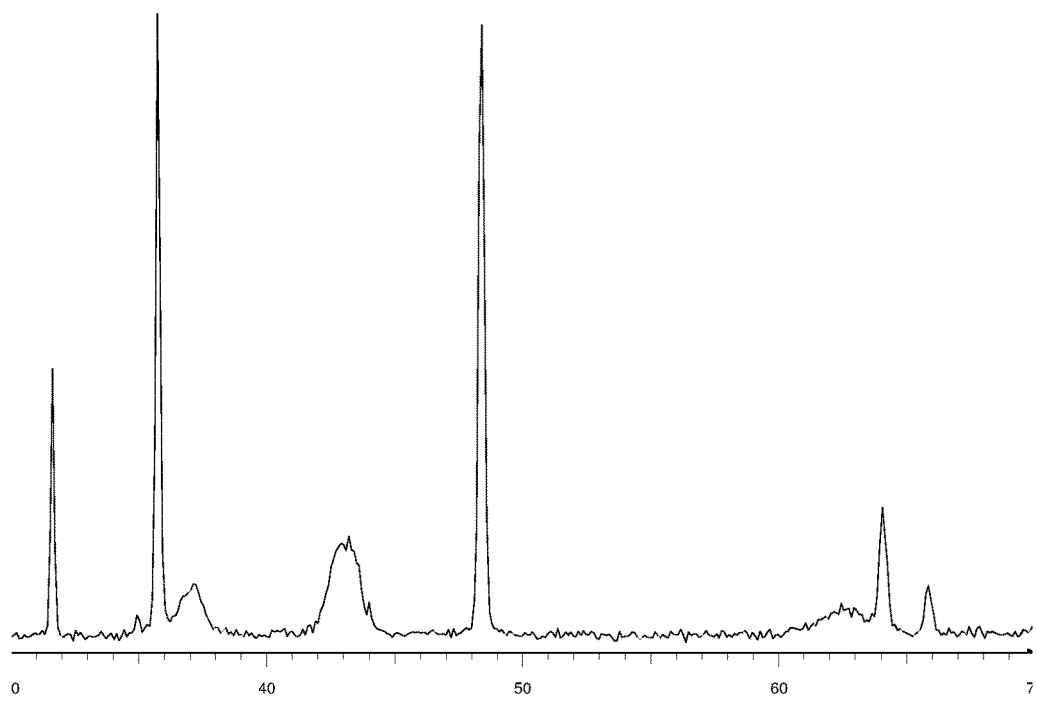
FIG. 4 shows an X-ray diffractogram of one embodiment of the present disclosure.

FIG. 4 shows an θ-2θ X-ray diffractogram of one embodiment of the present disclosure, verifying the sodium chloride structure of the as-deposited coating having a first (Ti,Al)-based nitride layer (2) of (Ti,Al)N and a second (Ti,Al)-based nitride layer 3 of laminated (Ti,Al)N and (Ti,Al,Cr)N layers with an average coating composition of Ti=58 at %, Al=36 at %, and Cr=6 at %, as determined by EDS operated at 20 kV, on a hardmetal (WC:Co) body (1). The broad diffraction peaks at about 37°, 43°, and 62.5° in 2Θ (x-axis) are the (111), (200), and (220) lattice planes, respectively of a sodium chloride structure. The rest of the peaks originate from the WC:Co body 1.

The deposition method for the innermost 5 and outermost layers 6 is based on PVD techniques, for example, reactive cathodic arc evaporation, using pure, composite or alloyed metal cathodes for growth of, e.g., TiN, TiC, Ti(C,N) or (Ti,Al)N layers, respectively. The desired layer compositions are obtained by selecting the appropriate reactive gas atmosphere and cathode composition, respectively. Layers are grown with an evaporation current between 50 A and 200 A, a higher current for larger cathode size, in a reactive gas atmosphere comprising pure $N_2$ or mixed $N_2$ and, e.g., Ar gases at a total gas pressure between 1.0 Pa and 8.0 Pa, for example, 1.0 Pa and 5.0 Pa, between 2.0 Pa and 5.0 Pa, or between 3.0 Pa and 5.0 Pa, and a negative substrate bias between 20 V and 300 V, for example, between 40 V and 150 V, or between 50 V and 100 V. The deposition temperature is between 200° C. and 800° C., for example, between 300° C. and 600° C.

According to one embodiment of the disclosure, the body is a cutting insert for machining by chip removal comprising a body 1 of a hard alloy of cemented carbide, cermet, ceramics, cubic boron nitride (cBN) based material or high speed steel. The body may also be other metal cutting tools, e.g., drills and end mills.

According to one embodiment the body is cemented carbide having WC/Co—94 wt %/6 wt %.

According to one embodiment the body is cemented carbide having WC/Co—95 wt %/5 wt %.

According to one embodiment the body is cemented carbide having WC/Co—87 wt %/13 wt %.

According to one embodiment of the disclosure, the body 1 is PCBN material containing 35 vol %<cBN<70 vol % in a binder with a bimodal cBN grain size distribution where at least about 50% of the cBN grains have a grain size<5 μm and at least 20% of the grains have a grain size>5 μm. The binder contains at least one compound including Al and at least one compound including Ti. An example of such a PCBN material and a method of producing it is described in published PCT application WO2014/177503.

The cBN grain size distribution and the grain size of the PCBN materials according to the disclosure is estimated according to the method described in published PCT application WO2014/177503.

EXAMPLES

For Tables 2-9 below, N is the number of A+B layers (bilayers) in the laminated sub-coating and at % is referring to the metallic part of the coating.

Example 1

Cemented carbide inserts, ISO geometry CNMG120408, with compositions WC/Co—95/5 wt %, grade A, were used as a body 1 for the layer depositions by cathodic arc evaporation.

Before deposition, the inserts were cleaned in ultrasonic baths of an alkali solution and alcohol. The system was evacuated to a pressure of less than $2.0 \times 10^{-3}$ Pa, after which the inserts, mounted on a rotating fixture, were sputter cleaned with Ar ions.

A first (Ti,Al)-based nitride sub-coating 2 of a single $(Ti_{1-x}Al_x)N_z$ layer with $0 \le x < 0.6$ and $0.9 \le z \le 1.1$ was deposited directly onto the WC:Co body from (Ti,Al) composite cathodes with compositions selected such to yield the desired coating composition (see Table 1) in 4.5 Pa pure $N_2$ atmosphere, a bias of −25 V, growth temperature of about 500° C. and an evaporation current of 150 A to a total sub-coating thickness of about 0.5 μm.

A second (Ti,Al)-based nitride sub-coating 3 of a laminated structure having alternating A and B layers: A/B/A/B/A/B . . . where layer A is $(Ti_{1-x}Al_x)N_z$, $0 \le x < 0.6$, and layer B is $(Ti_{1-x1-y1}Al_{x1}Cr_{y1})N_{z1}$, $0.55 < x1 < 0.65$, $0.05 < y1 < 0.15$, and $0.9 \le z1 \le 1.1$ was deposited from (Ti,Al) and (Ti,Al,Cr) composite cathodes with compositions selected such to yield the desired metallic compositions of the coatings (see Table 1) in 4.5 Pa pure $N_2$ atmosphere, a bias of −40 V, growth temperature of about 500° C. and an evaporation current of 150 A to a total sub-coating thickness of about 2.0 μm. Generally, a laminated coating structure could be obtained by allowing the coating body to alternately pass through the deposition flux from at least two different cathode compositions used for growth of the different layers, at otherwise fixed deposition conditions.

Here this is realized by placing the cathodes for growth of $(Ti_{1-x}Al_x)N_z$ and the cathodes for growth of $(Ti_{1-x1-y1}Al_{x1}Cr_{y1})N_{z1}$ opposite to and facing each other in the deposition system. Through fixture rotation, the inserts will alternately pass through the deposition flux from each cathode whereby two consecutive layers (so called bi-layer) will form from the condensing vapor during a full turn. The average individual thickness of these layers, controlled through the speed of rotation of the fixture, was between 1 nm and 100 nm.

TABLE 1

| Layer | Cathode composition | | |
|---|---|---|---|
| | Ti (at %) | Al (at %) | Cr (at %) |
| TiN | 100 | | |
| $(Ti_{0.77}Al_{0.23})N$ | 75 | 25 | |
| $(Ti_{0.44}Al_{0.56})N$ | 45 | 55 | |
| $(Ti_{0.32}Al_{0.58}Cr_{0.10})N$ | 30 | 60 | 10 |

The as-grown coatings metallic composition as obtained by EDS operated at 20 kV are shown in Table 2.

TABLE 2

| | Sample | Body | 1st Functional Coating - (Ti, Al)N | | 2nd Functional Coating - Laminate (Ti, Al)N/(Ti, Al, Cr)N | | | | | | | | N | Average Metal Composition | | |
|---|---|---|---|---|---|---|---|---|---|---|---|---|---|---|---|---|
| | | | | | (Ti, Al)N layer | | | (Ti, Al, Cr)N Layer | | | | | | | | |
| | | | Ti (at %) | Al (at %) | Ti (at %) | Al (at %) | d (nm) | Ti (at %) | Al (at %) | Cr (at %) | d (nm) | | Ti (at %) | Al (at %) | Cr (at %) |
| | 1 (invention) | grade A | 77 | 23 | 77 | 23 | 25 | 32 | 58 | 10 | 25 | 40 | 59 | 37 | 4 |
| | 2 (invention) | grade A | 77 | 23 | 77 | 23 | 12 | 32 | 58 | 10 | 12 | 83 | 59 | 37 | 4 |
| | 3 | grade A | 44 | 56 | 44 | 56 | 12 | 32 | 58 | 10 | 12 | 83 | 39 | 57 | 4 |
| | 4 | grade A | 100 | | 100 | | 12 | 32 | 58 | 10 | 12 | 83 | 73 | 23 | 4 |
| | 5 (invention) | grade A | 77 | 23 | 77 | 23 | 8 | 32 | 58 | 10 | 8 | 125 | 59 | 37 | 4 |
| Comparative | 6 | grade A | | | | | | 100 | | | | | | | |
| | 7 | grade A | | | | | | 44 | 56 | | | | | | |
| | 8 | grade A | | | | | | 77 | 23 | | | | | | |
| | 9 | grade A | | | | | | 32 | 58 | 10 | | | | | |

Example 2

In example 1, also cemented carbide inserts, ISO geometry TPUN160308, with composition WC/Co—94/6 wt %, grade B, were deposited at the same time with a coating metallic composition as shown in Table 3.

TABLE 3

| | Sample | Body | 1st Functional Coating - (Ti, Al)N | | 2nd Functional Coating - Laminate (Ti, Al)N/(Ti, Al, Cr)N | | | | | | | | N | Average Metal Composition | | |
|---|---|---|---|---|---|---|---|---|---|---|---|---|---|---|---|---|
| | | | | | (Ti, Al)N layer | | | (Ti, Al, Cr)N Layer | | | | | | | | |
| | | | Ti (at %) | Al (at %) | Ti (at %) | Al (at %) | d (nm) | Ti (at %) | Al (at %) | Cr (at %) | d (nm) | | Ti (at %) | Al (at %) | Cr (at %) |
| | 10 (invention) | grade B | 77 | 23 | 77 | 23 | 25 | 32 | 58 | 10 | 25 | 40 | 59 | 37 | 4 |
| | 11 (invention) | grade B | 77 | 23 | 77 | 23 | 12 | 32 | 58 | 10 | 12 | 83 | 59 | 37 | 4 |
| | 12 | grade B | 44 | 56 | 44 | 56 | 12 | 32 | 58 | 10 | 12 | 83 | 39 | 57 | 4 |
| | 13 | grade B | 100 | | 100 | | 12 | 32 | 58 | 10 | 12 | 83 | 73 | 23 | 4 |
| | 14 (invention) | grade B | 77 | 23 | 77 | 23 | 8 | 32 | 58 | 10 | 8 | 125 | 59 | 37 | 4 |
| Comparative | 15 | grade B | | | | | | 100 | | | | | | | |
| | 16 | grade B | | | | | | 44 | 56 | | | | | | |
| | 17 | grade B | | | | | | 77 | 23 | | | | | | |
| | 18 | grade B | | | | | | 32 | 58 | 10 | | | | | |

Example 3

In example 1, also cemented carbide inserts, ISO geometry XOMX120408TR-ME12, with composition WC/Co—87/13 wt %, grade C, were deposited at the same time with a coating metallic composition as shown in Table 4.

TABLE 4

| | | 1st Functional Coating - (Ti, Al)N | | 2nd Functional Coating - Laminate (Ti, Al)N/(Ti, Al, Cr)N | | | | | | | | Average Metal Composition | | |
|---|---|---|---|---|---|---|---|---|---|---|---|---|---|---|
| | | | | (Ti, Al)N layer | | | (Ti, Al, Cr)N Layer | | | | | | | |
| Sample | Body | Ti (at %) | Al (at %) | Ti (at %) | Al (at %) | d (nm) | Ti (at %) | Al (at %) | Cr (at %) | d (nm) | N | Ti (at %) | Al (at %) | Cr (at %) |
| 19 (invention) | grade C | 77 | 23 | 77 | 23 | 25 | 32 | 58 | 10 | 25 | 40 | 59 | 37 | 4 |
| 20 (invention) | grade C | 77 | 23 | 77 | 23 | 12 | 32 | 58 | 10 | 12 | 83 | 59 | 37 | 4 |
| 21 | grade C | 44 | 56 | 44 | 56 | 12 | 32 | 58 | 10 | 12 | 83 | 39 | 57 | 4 |
| 22 | grade C | 100 | | 100 | | 12 | 32 | 58 | 10 | 12 | 83 | 73 | 23 | 4 |
| 23 (invention) | grade C | 77 | 23 | 77 | 23 | 8 | 32 | 58 | 10 | 8 | 125 | 59 | 37 | 4 |
| Comparative 24 | grade C | | | | | | 100 | | | | | | | |
| 25 | grade C | | | | | | 44 | 56 | | | | | | |
| 26 | grade C | | | | | | 77 | 23 | | | | | | |
| 27 | grade C | | | | | | 32 | 58 | 10 | | | | | |

Example 4

Example 1 was repeated using PCBN inserts containing at least 30 vol % of cBN in a binder, grade D. The binder included at least one nitride, boride, oxide, carbide or carbonitrides compound selected from one or more of the elements belonging to the groups 4, 5 and 6 of the periodic table and Al, e.g., Ti(C,N) and AlN.

In addition to the layers grown in example 1, an outermost top layer 6 of a single $(Ti_{1-x-y}Al_x)N_z$, layer with $0 \leq x < 0.6$ and $0.9 \leq y \leq 1.1$ was deposited from (Ti,Al) composite cathodes with compositions selected such to yield the desired coating composition (see Table 1) in 4.5 Pa pure $N_2$ atmosphere, a bias of −40 V, growth temperature of about 500° C. and an evaporation current of 150 A to a total sub-coating thickness of about 0.1 μm.

The as-grown coatings and their deposition parameters as well as their metallic composition as obtained by EDS operated at 20 kV are shown in Table 5.

TABLE 5

| | | 1st Functional Coating - (Ti, Al)N | | 2nd Functional Coating - Laminate (Ti, Al)N/(Ti, Al, Cr)N | | | | | | | | Outermost Top Layer (Ti, Al)N | | Average Metal Composition | | |
|---|---|---|---|---|---|---|---|---|---|---|---|---|---|---|---|---|
| | | | | (Ti, Al)N layer | | | (Ti, Al, Cr)N Layer | | | | | | | | | |
| Sample | Body | Ti (at %) | Al (at %) | Ti (at %) | Al (at %) | d (nm) | Ti (at %) | Al (at %) | Cr (at %) | d (nm) | N | Ti (at %) | Al (at %) | Ti (at %) | Al (at %) | Cr (at %) |
| 28 (invention) | grade D | 77 | 23 | 77 | 23 | 25 | 32 | 58 | 10 | 25 | 40 | 77 | 23 | 60 | 36 | 4 |
| 29 (invention) | grade D | 77 | 23 | 77 | 23 | 12 | 32 | 58 | 10 | 12 | 83 | 77 | 23 | 60 | 36 | 4 |
| 30 | grade D | 44 | 56 | 44 | 56 | 12 | 32 | 58 | 10 | 12 | 83 | 44 | 56 | 39 | 57 | 4 |
| 31 | grade D | 100 | | 100 | | 12 | 32 | 58 | 10 | 12 | 83 | 100 | | 74 | 22 | 4 |
| 32 (invention) | grade D | 77 | 23 | 77 | 23 | 8 | 32 | 58 | 10 | 8 | 125 | 77 | 23 | 60 | 36 | 4 |
| Comparative 33 | grade D | | | | | | 100 | | | | | | | | | |
| 34 | grade D | | | | | | 44 | 56 | | | | | | | | |
| 35 | grade D | | | | | | 77 | 23 | | | | | | | | |
| 36 | grade D | | | | | | 32 | 58 | 10 | | | | | | | |

Example 5

In example 4, also PCBN inserts containing 30 vol %<cBN<70 vol %, preferably 40 vol %<cBN<65 vol % in a binder with an average cBN grain size between 0.5 μm and 4 μm, grade E, were deposited at the same time with a coating metallic composition as shown in Table 6. The binder contains 80 wt %<Ti(C,N)<95 wt % and the rest comprising compounds from two or more of the following group of elements: Ti, N, B, Ni, Cr, Mo, Nb, Fe, Al and O, e.g., $TiB_2$ and $Al_2O_3$.

TABLE 6

| | | 1st Functional Coating - (Ti, Al)N | | 2nd Functional Coating - Laminate (Ti, Al)N/(Ti, Al, Cr)N | | | | | | | Outermost Top Layer (Ti, Al)N | | Average Metal Composition | | |
|---|---|---|---|---|---|---|---|---|---|---|---|---|---|---|---|
| | | | | (Ti, Al)N layer | | | (Ti, Al, Cr)N Layer | | | | | | | | |
| Sample | Body | Ti (at %) | Al (at %) | Ti (at %) | Al (at %) | d (nm) | Ti (at %) | Al (at %) | Cr (at %) | d (nm) | N | Ti (at %) | Al (at %) | Ti (at %) | Al (at %) | Cr (at %) |
| 37 (invention) | grade E | 77 | 23 | 77 | 23 | 25 | 32 | 58 | 10 | 25 | 40 | 77 | 23 | 60 | 36 | 4 |
| 38 (invention) | grade E | 77 | 23 | 77 | 23 | 12 | 32 | 58 | 10 | 12 | 83 | 77 | 23 | 60 | 36 | 4 |
| 39 | grade E | 44 | 56 | 44 | 56 | 12 | 32 | 58 | 10 | 12 | 83 | 44 | 56 | 39 | 57 | 4 |
| 40 | grade E | 100 | | 100 | | 12 | 32 | 58 | 10 | 12 | 83 | 100 | | 74 | 22 | 4 |
| 41 (invention) | grade E | 77 | 23 | 77 | 23 | 8 | 32 | 58 | 10 | 8 | 125 | 77 | 23 | 60 | 36 | 4 |
| Comparative 42 | grade E | | | | | | 100 | | | | | | | | | |
| 43 | grade E | | | | | | 44 | 56 | | | | | | | | |
| 44 | grade E | | | | | | 77 | 23 | | | | | | | | |
| 45 | grade E | | | | | | 32 | 58 | 10 | | | | | | | |

Example 6

In example 4, also PCBN inserts having 45 vol %<cBN<70 vol %, for example, 55 vol %<cBN<65 vol % in a binder with an average cBN grain size between 0.5 μm and 4 μm, for example, between 1 μm and 3 μm, grade F, were deposited at the same time with a coating metallic composition as shown in Table 7. The binder contained 80 wt %<Ti(C,N)<90 wt %, less than 1 wt. % of an alloy having one or more of the elements: (Ni, Co, and Cr); less than 10 wt % Mo; and rest of mainly TiB$_2$ and Al$_2$O$_3$.

TABLE 7

| | | 1st Functional Coating - (Ti, Al)N | | 2nd Functional Coating - Laminate (Ti, Al)N/(Ti, Al, Cr)N | | | | | | | Outermost Top Layer (Ti, Al)N | | Average Metal Composition | | |
|---|---|---|---|---|---|---|---|---|---|---|---|---|---|---|---|
| | | | | (Ti, Al)N layer | | | (Ti, Al, Cr)N Layer | | | | | | | | |
| Sample | Body | Ti (at %) | Al (at %) | Ti (at %) | Al (at %) | d (nm) | Ti (at %) | Al (at %) | Cr (at %) | d (nm) | N | Ti (at %) | Al (at %) | Ti (at %) | Al (at %) | Cr (at %) |
| 46 (invention) | grade F | 77 | 23 | 77 | 23 | 25 | 32 | 58 | 10 | 25 | 40 | 77 | 23 | 60 | 36 | 4 |
| 47 (invention) | grade F | 77 | 23 | 77 | 23 | 12 | 32 | 58 | 10 | 12 | 83 | 77 | 23 | 60 | 36 | 4 |
| 48 | grade F | 44 | 56 | 44 | 56 | 12 | 32 | 58 | 10 | 12 | 83 | 44 | 56 | 39 | 57 | 4 |
| 49 | grade F | 100 | | 100 | | 12 | 32 | 58 | 10 | 12 | 83 | 100 | | 74 | 22 | 4 |
| 50 (invention) | grade F | 77 | 23 | 77 | 23 | 8 | 32 | 58 | 10 | 8 | 125 | 77 | 23 | 60 | 36 | 4 |
| Comparative 51 | grade F | | | | | | 100 | | | | | | | | | |
| 52 | grade F | | | | | | 44 | 56 | | | | | | | | |
| 53 | grade F | | | | | | 77 | 23 | | | | | | | | |
| 54 | grade F | | | | | | 32 | 58 | 10 | | | | | | | |

Example 7

In example 4, also PCBN inserts containing more than 70 vol % cBN, for example, 80 vol %<cBN<95 vol % in a binder with a bimodal cBN grain size distribution where part of the cBN grains have a grain size<10 μm, for example, between 0.5 μm and 10 μm, or between 1 μm and 6 μm, and another part of the cBN grains have a grain size>10 μm, for example, between 10 μm and 25 μm or between 15 μm and 25 μm, grade G, were deposited at the same time with a coating metallic composition as shown in Table 8. The binder included compounds of two or more of the elements Al, B, N, W, Co, Ni, Fe, Al and/or O.

TABLE 8

| | | 1st Functional Coating - (Ti, Al)N | | 2nd Functional Coating - Laminate (Ti, Al)N/(Ti, Al, Cr)N | | | | | | | | Outermost Top Layer (Ti, Al)N | | Average Metal Composition | | |
|---|---|---|---|---|---|---|---|---|---|---|---|---|---|---|---|---|
| | | | | (Ti, Al)N layer | | | (Ti, Al, Cr)N Layer | | | | | | | | | |
| Sample | Body | Ti (at %) | Al (at %) | Ti (at %) | Al (at %) | d (nm) | Ti (at %) | Al (at %) | Cr (at %) | d (nm) | N | Ti (at %) | Al (at %) | Ti (at %) | Al (at %) | Cr (at %) |
| 55 (invention) | grade G | 77 | 23 | 77 | 23 | 25 | 32 | 58 | 10 | 25 | 40 | 77 | 23 | 60 | 36 | 4 |
| 56 (invention) | grade G | 77 | 23 | 77 | 23 | 12 | 32 | 58 | 10 | 12 | 83 | 77 | 23 | 60 | 36 | 4 |
| 57 | grade G | 44 | 56 | 44 | 56 | 12 | 32 | 58 | 10 | 12 | 83 | 44 | 56 | 39 | 57 | 4 |
| 58 | grade G | 100 | | 100 | | 12 | 32 | 58 | 10 | 12 | 83 | 100 | | 74 | 22 | 4 |
| 59 (invention) | grade G | 77 | 23 | 77 | 23 | 8 | 32 | 58 | 10 | 8 | 125 | 77 | 23 | 60 | 36 | 4 |
| Comparative 60 | grade G | | | | | | 100 | | | | | | | | | |
| 61 | grade G | | | | | | 44 | 56 | | | | | | | | |
| 62 | grade G | | | | | | 77 | 23 | | | | | | | | |
| 63 | grade G | | | | | | 32 | 58 | 10 | | | | | | | |

Example 8

In example 4, also PCBN inserts containing 35 vol %<cBN<70 vol % in a binder with a bimodal cBN grain size distribution where at least about 50% of the cBN grains have a grain size<5 μm and at least 20% of the grains have a grain size>5 μm, Grade H, were deposited at the same time with a coating metallic composition as shown in Table 9. The binder contains at least one compound including Al and at least one compound including Ti.

TABLE 10

| Sample # | Relative performance (%) |
|---|---|
| 2 | 90-100 |
| 7 | 85-95 |
| 9 | 70-80 |
| 3 | 60-70 |

TABLE 9

| | | 1st Functional Coating - (Ti, Al)N | | 2nd Functional Coating - Laminate (Ti, Al)N/(Ti, Al, Cr)N | | | | | | | | Outermost Top Layer (Ti, Al)N | | Average Metal Composition | | |
|---|---|---|---|---|---|---|---|---|---|---|---|---|---|---|---|---|
| | | | | (Ti, Al)N layer | | | (Ti, Al, Cr)N Layer | | | | | | | | | |
| Sample | Body | Ti (at %) | Al (at %) | Ti (at %) | Al (at %) | d (nm) | Ti (at %) | Al (at %) | Cr (at %) | d (nm) | N | Ti (at %) | Al (at %) | Ti (at %) | Al (at %) | Cr (at %) |
| 64 (invention) | grade H | 77 | 23 | 77 | 23 | 25 | 32 | 58 | 10 | 25 | 40 | 77 | 23 | 60 | 36 | 4 |
| 65 (invention) | grade H | 77 | 23 | 77 | 23 | 12 | 32 | 58 | 10 | 12 | 83 | 77 | 23 | 60 | 36 | 4 |
| 66 | grade H | 44 | 56 | 44 | 56 | 12 | 32 | 58 | 10 | 12 | 83 | 44 | 56 | 39 | 57 | 4 |
| 67 | grade H | 100 | | 100 | | 12 | 32 | 58 | 10 | 12 | 83 | 100 | | 74 | 22 | 4 |
| 68 (invention) | grade H | 77 | 23 | 77 | 23 | 8 | 32 | 58 | 10 | 8 | 125 | 77 | 23 | 60 | 36 | 4 |
| Comparative 69 | grade H | | | | | | 100 | | | | | | | | | |
| 70 | grade H | | | | | | 44 | 56 | | | | | | | | |
| 71 | grade H | | | | | | 77 | 23 | | | | | | | | |
| 72 | grade H | | | | | | 32 | 58 | 10 | | | | | | | |

Example 9

For a cutting test, the samples from Table 2 (coated grade A in example 1) were used in a turning operation with the following data:

Geometry: CNMG120412-MF5
Application: Facing
Work piece material: 34CrNiMo6, 48-52 HRc
Cutting speed: 130 m/min
Feed: 0.25 mm/rev.
Depth of cut: 0.3 mm
Cooling No
Performance criterion: Crater wear resistance Table 10 shows the relative cutting performance of the disclosure indicating a performance boost for sample 2.

Example 10

For a cutting test the samples from Table 3 (coated grade B in example 2) were used in a turning operation with the following data:

Geometry: TPUN160308
Application: Facing
Work piece material: 100Cr6
Cutting speed: 320 m/min
Feed: 0.25 mm/rev.
Depth of cut: 2 mm
Cooling Yes
Performance criterion: Crater wear resistance

TABLE 11

| Sample # | Performance |
|---|---|
| 11 | good |
| 12 | ok |

TABLE 11-continued

| Sample # | Performance |
| --- | --- |
| 16 | ok |
| 18 | ok |

Table 11 shows the relative cutting performance of the disclosure indicating a performance boost for coating 11.

Example 11

For a cutting test the samples from Table 4 (coated grade C in example 3) were used in a turning operation with the following data:
Geometry: XOMX120408TR-M12
Application: Side milling
Work piece material: 42CrMo4
Cutting speed: 400 m/min
Feed: 0.3 mm/rev
Depth of cut: 3 mm
D ($a_e$) 65 mm (20%)
Cooling No
Performance criterion: Tool life
Table 12 shows the tool life time results of the disclosure indicating a performance boost for samples 21 and 22.

TABLE 12

| Sample # | Life time (min) |
| --- | --- |
| 21 | 27 |
| 22 | 26 |
| 20 | 23 |
| 25 | 22 |

Example 12

For a cutting test the samples from Table 9 (coated grade H in example 8), including an uncoated PCBN grade H insert, were used in a turning operation with the following data:
Geometry: CNGA 120408S-01525-L1-B
Application: Continuous cutting
Work piece material: SAE 8620, 58-62 HRC
Cutting speed: 250 m/min
Feed: 0.1 mm
Depth of cut: 0.1 mm
Cooling No
Performance criterion: Tool life
Table 13 shows the tool life time results of the disclosure indicating a clear performance boost for sample 65.

TABLE 13

| Sample # | Tool life (km) |
| --- | --- |
| 65 | 11.47 |
| 66 | 9.4 |
| 67 | 7.26 |
| uncoated Grade H | 6.67 |

Example 13

For a cutting test the samples from Table 9 (coated grade H in example 8), were used in a turning operation with the following data:
Geometry: CNGA 120408S-01525-L1-B
Application: Continuous cutting
Work piece material: SAE 8620, 58-62 HRC
Cutting speed: 250 m/min
Feed: 0.1 mm
Depth of cut: 0.1 mm
Cooling No
Performance criterion: Material ratio, Rmr 50% after 50 passes.
Rmr is a standard measure for material ratio of a surface roughness profile and often used to evaluate wear resistance. Table 14 shows a reduced material ratio, Rmr 50% depth after 50 passes for samples 65 and 67 compared to for sample 66.

TABLE 14

| Sample # | Rmr 50% depth |
| --- | --- |
| 65 | −1.55 |
| 66 | −3.95 |
| 67 | −1.28 |

Example 14

For a cutting test the samples from Table 9 (coated grade H in example 8), were used in a turning operation with the following data:
Geometry: CNGA 120408S-01525-L1-B
Application: Continuous cutting
Work piece material: SAE 8620, 58-62 HRC
Cutting speed: 250 m/min
Feed: 0.1 mm
Depth of cut: 0.1 mm
Cooling No
Performance criterion: Crater wear/crater depth
Table 15 shows best crater wear resistance for sample 65 compared to samples 66, 67 and uncoated grade H.

TABLE 15

| Sample # | Crated depth |
| --- | --- |
| 65 | 17.04 |
| 66 | 18.37 |
| 67 | 20.04 |
| Uncoated Grade H | 17.7 |

Example 15

For a cutting test the samples from Table 9 (coated grade H in example 8), were used in a turning operation with the following data:
Geometry: TCGW110208S-01015-11-C
Application: ID Turning, diameter 24.69 mm, length 7.6 mm
Work piece material: 100Cr6, 60 HRc
Cutting speed: 143 m/min
Feed: 0.15 mm/rev
Depth of cut: 0.15 mm
Cooling: Yes, but only for chip evacuation
Performance criterion: Tool life
Table 16 shows increased performance for sample 65 compared to the prior art sample.

TABLE 16

| Sample # | Relative performance (%) |
| --- | --- |
| 65 | 150-200 |
| Prior art sample | 90-100 |

Example 16

For a cutting test the samples from Table 9 (coated grade H in example 8), were used in a turning operation with the following data:
Geometry: DNGA150612S-01525-L1-B
Application: OD Turning, diameter 45 mm, length 26 mm
Work piece material: 25MoCr4E, 58-64 HRc
Cutting speed: 260 m/min
Feed: 0.15 mm/rev
Depth of cut: 0.2 mm
Cooling: No
Performance criterion: Tool life Table 17 shows increased performance for sample 65 compared to the prior art sample.

TABLE 17

| Sample # | Relative performance (%) |
| --- | --- |
| 65 | 180-200 |
| Prior art sample | 90-100 |

Although the present embodiment(s) has been described in relation to particular aspects thereof, many other variations and modifications and other uses will become apparent to those skilled in the art. It is preferred therefore, that the present embodiment(s) be limited not by the specific disclosure herein, but only by the appended claims.

The invention claimed is:

1. A coated cutting tool comprising:
a body, wherein the body comprises cemented carbide, cermet, ceramics, polycrystalline diamond or polycrystalline cubic boron nitride based materials; and
a hard and wear resistant PVD coating disposed on the body, the coating having a plurality of sub-coatings including a (Ti,Al)N sub-coating and a (Ti,Al,Cr)N sub-coating, the (Ti,Al)N sub-coating being a single layer, and the (Ti,Al,Cr)N sub-coating being a laminated structure, wherein the (Ti,Al)N sub-coating includes a $(Ti_{1-x}Al_x)N_z$-layer where $0.1<x<0.4$, $0.6<z<1.2$, and wherein the (Ti,Al,Cr)N sub-coating includes a $(Ti_{1-x1-y1}Al_{x1}Cr_{y1})N_z$-layer where $0.5<x1<0.75$, $0.05<y1<0.2$, $0.6<z1<1.2$, the (Ti,Al,Cr)N sub-coating being a laminated structure having alternating A and B layers: A/B/A/B/A/B/ . . . , where layer A is $(Ti_{1-x}Alx)N_z$, $0.1<x<0.4$, $0.6<z<1.2$, and layer B is $(Ti_{1-x1-y1}Al_{x1}Cr_{y1})N_z$, $0.5<x1<0.75$, $0.05<y1<0.2$, $0.6<z1<1.2$, wherein the A and B layers have an average individual layer thickness between 1 nm and 100 nm.

2. The coated cutting tool according to claim 1, wherein said (Ti,Al)N sub-coating has a thickness between 0.1 μm and 2 μm.

3. The coated cutting tool according to claim 1, wherein $0.15<x<0.35$.

4. The coated cutting tool according to claim 1, wherein $0.55<x1<0.75$.

5. The coated cutting tool according to claim 1, wherein $0.05 \leq y1<0.15$.

6. The coated cutting tool according to claim 1, wherein $0.8<z1 \leq 1.1$.

7. The coated cutting tool according to claim 1, wherein the (Ti,Al,Cr)N sub-coating has a thickness between 0.5 μm and 10 μm.

8. The coated cutting tool according to claim 1, wherein the coated cutting tool includes an innermost single or laminated layer structure arranged on and in contact with said body, the innermost layer structure being disposed between the body and the hard and wear resistant coating and including at least one of the following compositions: TiN, TiC, Ti(C,N) or (Ti,Al)N.

9. The coated cutting tool according to claim 8, wherein the coated cutting tool includes an outermost single or laminated layer structure arranged on said coating, and including at least one of the following compositions: TiN, TiC, Ti(C,N) and (Ti,Al)N.

10. The coated cutting tool according to claim 9, wherein the total thickness of the coating, and any innermost or outermost layer structures is between 0.8 μm and 15 μm.

11. The coated cutting tool according to claim 9, wherein the average composition of the coating including any innermost or outermost layer structures is 55 at %<% Ti<62 at %, 32 at %<% Al<40 at %, 1 at %<% Cr<9 at %, % Ti+% Al+% Cr=100 at % and balanced with N.

12. The coated cutting tool according to claim 1, wherein said body is cemented carbide including WC and 4-15 wt % Co.

13. The coated cutting tool according to claim 1, wherein the body is polycrystalline cubic boron nitride (PCBN) containing at least 25 vol % of cubic boron nitride (cBN) in a binder, and the binder including at least one nitride, boride, oxide, carbide or carbonitride compound selected from one or more of the following group of elements: Ti, Zr, Hf, V, Nb, Ta, Cr, Mo, W and Al.

14. The coated cutting tool according to claim 1, wherein the body is polycrystalline cubic boron nitride (PCBN) containing 30 vol %<cBN<75 vol %, in a binder, and with an average cBN grain size between 0.5 m and 10 m, the binder contains 80 wt %<Ti(C,N)<95 wt % and the rest of the binder including compounds from two or more of the following group of elements: Ti, N, B, Ni, Cr, Mo, Nb, Fe, Al and O.

15. The coated cutting tool according to claim 1, wherein the body is polycrystalline cubic boron nitride (PCBN) containing 35 vol %<cBN<75 vol % in a binder with a bimodal cBN grain size distribution where at least about 50% of the cBN grains have a grain size<5 μm and at least 20% of the grains have a grain size>5 μm, and the binder contains at least one compound including Al and at least one compound including Ti.

16. The coated cutting tool according to claim 1, wherein the body is polycrystalline cubic boron nitride (PCBN) containing 30 vol %<cBN<75 vol %, in a binder, with an average cBN grain size between 0.5 m and 5 m, the binder contains 80 wt %<Ti(C,N)<90 wt %; less than 1 wt. % of an alloy containing one or more of the following group of elements: Ni, Co, Cr; less than 10 wt % Mo; and the rest of the binder includes at least one of the following compounds: $TiB_2$, $Al_2O_3$.

17. A method for manufacturing a coated cutting tool according to claim 1, by applying physical vapor deposition (PVD) techniques, including cathodic arc evaporation, the method comprising:
cleaning of the body prior to deposition; and
growing of (Ti,Al)N and (Ti,Al,Cr)N layers by using composite or alloyed (Ti,Al) and (Ti,Al,Cr) cathodes, respectively, applying an evaporation current between 50 A and 200 A, using a reactive gas atmosphere comprising pure $N_2$ or mixed $N_2$ and Ar gases at a total gas pressure between 1.0 Pa and 8.0 Pa, applying a negative substrate bias between 20 V and 300 V, and applying a deposition temperature between 200° C. and 800° C.

* * * * *